US008390174B2

(12) United States Patent
Sadaka

(10) Patent No.: US 8,390,174 B2
(45) Date of Patent: Mar. 5, 2013

(54) CONNECTIONS FOR ULTRASOUND TRANSDUCERS

(75) Inventor: Alain Sadaka, San Jose, CA (US)

(73) Assignee: Boston Scientific SciMed, Inc., Maple Grove, MN (US)

( * ) Notice: Subject to any disclaimer, the term of this patent is extended or adjusted under 35 U.S.C. 154(b) by 1467 days.

(21) Appl. No.: 11/965,178

(22) Filed: Dec. 27, 2007

(65) Prior Publication Data

US 2009/0171216 A1 Jul. 2, 2009

(51) Int. Cl.
*H01L 41/08* (2006.01)

(52) U.S. Cl. .......................................... 310/334

(58) Field of Classification Search ........... 310/334–337
See application file for complete search history.

(56) References Cited

U.S. PATENT DOCUMENTS

| | | | | |
|---|---|---|---|---|
| 4,217,684 | A * | 8/1980 | Brisken et al. | 29/25.35 |
| 5,296,777 | A * | 3/1994 | Mine et al. | 310/334 |
| 5,329,498 | A * | 7/1994 | Greenstein | 367/155 |
| 5,920,523 | A * | 7/1999 | Hanafy et al. | 367/140 |
| 6,106,474 | A | 8/2000 | Koger et al. | |
| 6,225,729 | B1 | 5/2001 | Izumi et al. | |
| 6,251,073 | B1 | 6/2001 | Imran et al. | |
| 6,280,388 | B1 | 8/2001 | Koger et al. | |
| 6,475,151 | B2 | 11/2002 | Koger et al. | |
| 6,569,102 | B2 | 5/2003 | Imran et al. | |
| 6,773,399 | B2 | 8/2004 | Xi et al. | |
| 6,776,762 | B2 * | 8/2004 | Erikson et al. | 600/459 |
| 6,896,658 | B2 | 5/2005 | Ji et al. | |
| 6,936,008 | B2 | 8/2005 | Tarakci et al. | |
| 7,143,487 | B2 * | 12/2006 | Kikuchi et al. | 29/25.35 |
| 7,361,145 | B2 | 4/2008 | Xi et al. | |
| 7,795,784 | B2 * | 9/2010 | Davidsen et al. | 310/334 |
| 7,808,157 | B2 * | 10/2010 | Oakley et al. | 310/334 |

(Continued)

FOREIGN PATENT DOCUMENTS

| | | | |
|---|---|---|---|
| EP | 0676742 | A2 | 10/1995 |
| WO | 01/13796 | | 3/2001 |

(Continued)

OTHER PUBLICATIONS

International Search Report and Written Opinion for International Application No. PCT/US2008/087504, Mailed on May 11, 2010.

(Continued)

*Primary Examiner* — Mark Budd
(74) *Attorney, Agent, or Firm* — Frommer Lawrence & Haug LLP; Bruce E. Black

(57) ABSTRACT

Described herein are electrical connections to acoustic elements, e.g., piezoelectric elements. In an exemplary embodiment, a transducer comprises an acoustic element, a passive layer attached to the acoustic element, and a conductive post embedded in the passive layer to provide a direct low resistance electrical connection to the acoustic element. In one embodiment, the conductive post has an exposed side surface allowing electrical connections to be made from the side of the transducer. In another embodiment, the conductive post has an exposed bottom surface allowing electrical connections to be made from the bottom of the transducer. In another embodiment, the transducer comprises an extension substrate adjacent to the acoustic element for protecting the acoustic element from thermal stress when a connection is made to the transducer at high temperatures. In one embodiment, a circuit is integrated on the extension substrate to process signals to or from the acoustic element.

23 Claims, 18 Drawing Sheets

U.S. PATENT DOCUMENTS

| | | | |
|---|---|---|---|
| 2001/0014775 | A1 | 8/2001 | Koger et al. |
| 2002/0038088 | A1 | 3/2002 | Imran et al. |
| 2002/0138002 | A1 | 9/2002 | Tarakci et al. |
| 2003/0078497 | A1 | 4/2003 | Ji et al. |
| 2003/0220573 | A1 | 11/2003 | Imran et al. |
| 2004/0024316 | A1 | 2/2004 | Xi et al. |
| 2004/0267138 | A1 | 12/2004 | Xi et al. |
| 2005/0131294 | A1 | 6/2005 | Ji et al. |
| 2006/0036178 | A1 | 2/2006 | Tarakci et al. |

FOREIGN PATENT DOCUMENTS

| | | | |
|---|---|---|---|
| WO | 02/054827 | A2 | 7/2002 |
| WO | 2007/017776 | A2 | 2/2007 |

OTHER PUBLICATIONS

International Preliminary Report on Patentability for International Application No. PCT/US2008/087504, Mailed on Jul. 8, 2010.

* cited by examiner

CONNECTIONS FOR ULTRASOUND TRANSDUCERS

FIELD OF THE INVENTION

The present invention relates to ultrasound transducers, and more particularly to connections for ultrasound transducers.

BACKGROUND INFORMATION

An ultrasound transducer is typically fabricated as a stack of multiple layers that depend on the application of the transducer. FIGS. 1*a* and 1*b* show typical ultrasound transducers. Each transducer comprises, from the bottom up, a backing layer 30, a bottom electrode layer 17, an active element layer (e.g., piezoelectric element or PZT) 10, a top electrode layer 13, a matching layer (or multiple matching layers) 20, and a lens layer (for focused transducers) 35 and 45. The lens may be a convex lens 35 or a concave lens 45. The backing, matching and lens layers are all passive materials that are used to improve and optimize the performance of the transducer. The backing layer is used to attenuate ultrasound energy propagating from the bottom of the transducer so that ultrasound emissions are directed from the top of the transducer and the matching layer is used to enhance acoustic coupling between the transducer and surrounding environment.

In most stacked transducers, the active element (e.g., PZT) must electrically communicate with a system that drives the active element, receives signals from the active element, or both. For ultrasound transducers, the active element converts electrical energy into mechanical energy to generate ultrasound waves, and vice versa to sense ultrasound waves. This makes the physical connections between the system and the active element critical and demanding. In Intravascular Ultrasound (IVUS) applications, the demands on these connections may be compounded due to the following reasons: the scale of operation may be in the micron range, the ultrasound device may have to meet sterilization compatibility requirements, and the ultrasound device may be rotated at high speeds in continuously varying anatomy.

SUMMARY OF THE INVENTION

Described herein are electrical connections to acoustic elements, e.g., piezoelectric elements, having lower resistance and reduced signal loss.

In an exemplary embodiment, a transducer comprises an active acoustic element, a passive layer attached to the acoustic element, and a conductive post embedded in the passive layer to provide a direct low resistance electrical connection to the acoustic element. In one embodiment, the conductive post has an exposed side surface allowing electrical connections to be made from the side of the transducer. In another embodiment, the conductive post has an exposed bottom surface allowing electrical connections to be made from the bottom of the transducer.

The conductive post advantageously provides a lower resistance connection to the transducer compared with the prior art in which a connection is made to the transducer through a housing and/or a backing layer. Further, the conductive post provides for robust connections that can withstand exposure to sterilizers at elevated temperatures during sterilization of the transducer.

In another embodiment, the transducer comprises an extension substrate adjacent to the acoustic element and attached to the same electrode as the acoustic element. The extension substrate protects the acoustic element from thermal stress when a connection is made to the electrode at high temperatures, e.g., soldering or laser welding. In one embodiment, the conductive post is aligned with the extension substrate. When a lead or other conductor is connected to the conductive post at high temperatures, the extension substrate is subjected to the high temperatures instead of the acoustic element, thereby protecting the acoustic element. The lead or other conductor may also be connected to the electrode without the conductive post, e.g., by soldering the lead directly to the electrode. The extension substrate may comprise silicon, the same material as the acoustic element, or other material. In one embodiment, the extension substrate comprises an integrated circuit for processing signals to or from the active acoustic element.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

In order to better appreciate the above recited and other advantages of the present inventions are objected, a more particular description of the invention briefly described above will be rendered by reference to specific embodiments thereof, which are illustrated in the accompanying drawings. It should be noted that the components in the figures are not necessarily to scale, emphasis instead being placed upon illustrating the principles of the invention. Moreover, in the figures, like reference numerals designate corresponding parts throughout the different views. However, like parts do not always have like reference numerals. Moreover, all illustrations are intended to convey concepts, where relative sizes, shapes and other detailed attributes may be illustrated schematically rather than literally or precisely.

FIG. 4(*b*) shows a lead connected to an exposed bottom surface of the conductive post according to an embodiment of the present invention.

FIG. 4(*c*) shows an integrated circuit (IC) chip connected to the exposed bottom surface of the conductive post according to an embodiment of the present invention.

DETAILED DESCRIPTION

Figure 1A:
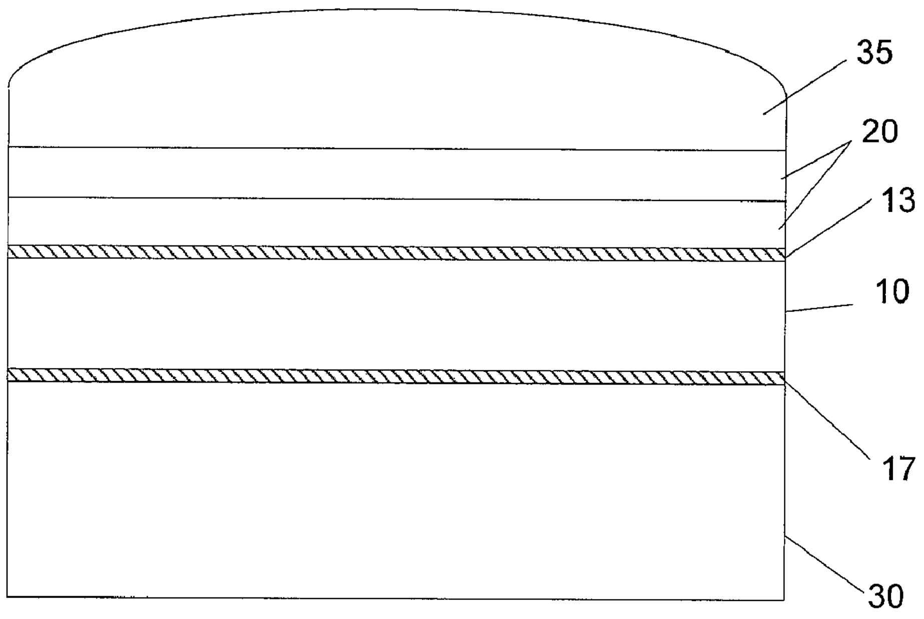
FIG. 1(a) (Prior Art)
FIG. 1*a* shows a prior art ultrasound transducer comprising of a stack of layers with a convex lens.
Figure 1B:
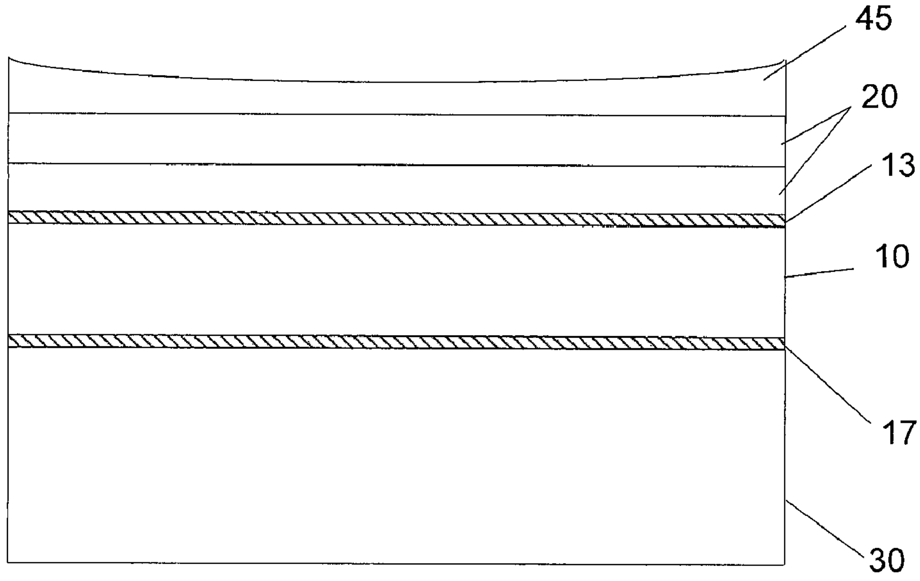
FIG. 1(b) (Prior Art)
FIG. 1*b* shows a prior art ultrasound transducer comprising of a stack of layers with a concave lens.
Figure 2:
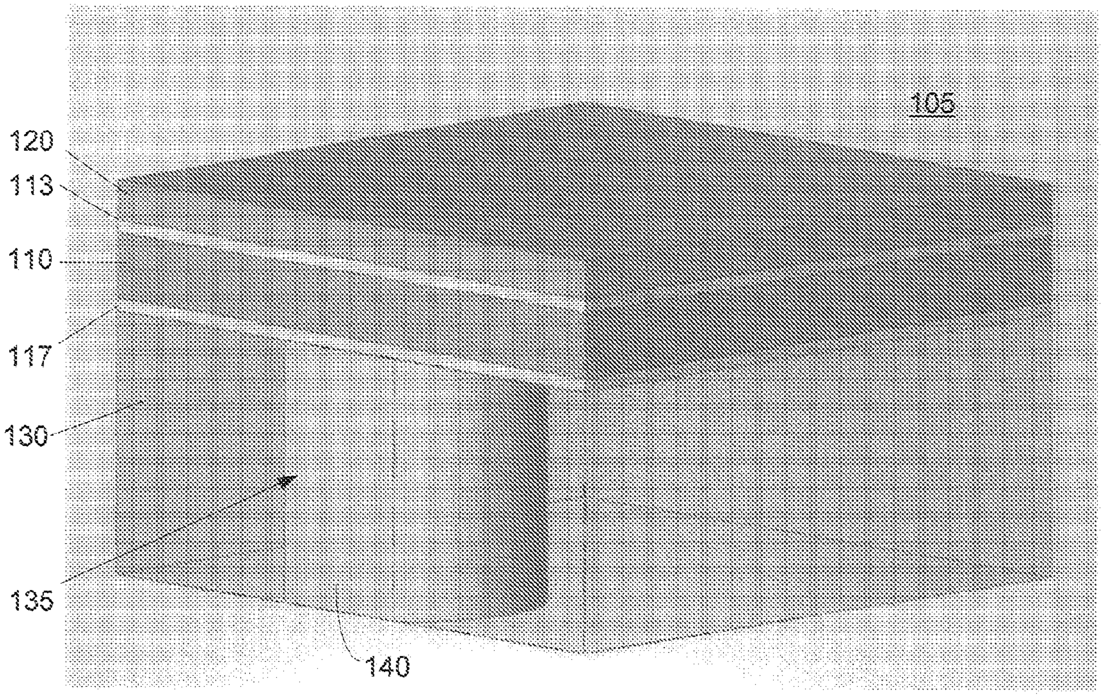
FIG. 2 shows a perspective view of a transducer comprising a conductive post for providing a direct electrical connection to the acoustic element of the transducer according to an embodiment of the present invention.
Figure 3:
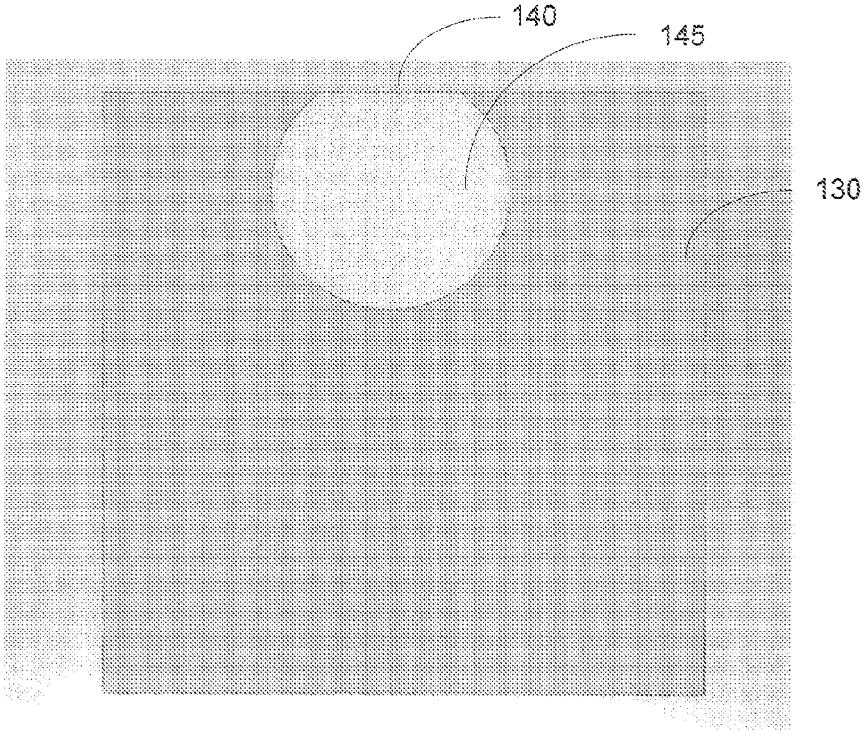
FIG. 3 shows a bottom view of the transducer in FIG. 2.

FIGS. 2 and 3 show an exemplary stacked transducer 105 according to an embodiment of the invention. The transducer 105 comprises an active acoustic element 110, e.g., a piezoelectric element, and top and bottom electrodes 113 and 117 deposited on the top and bottom surfaces of the active element 110, respectively. The electrodes 113 and 117 may comprise thin layers of gold, chrome, or other conductive material. The transducer's emitting face may have a square shape, circular shape, or other shape.

Figure 4A:
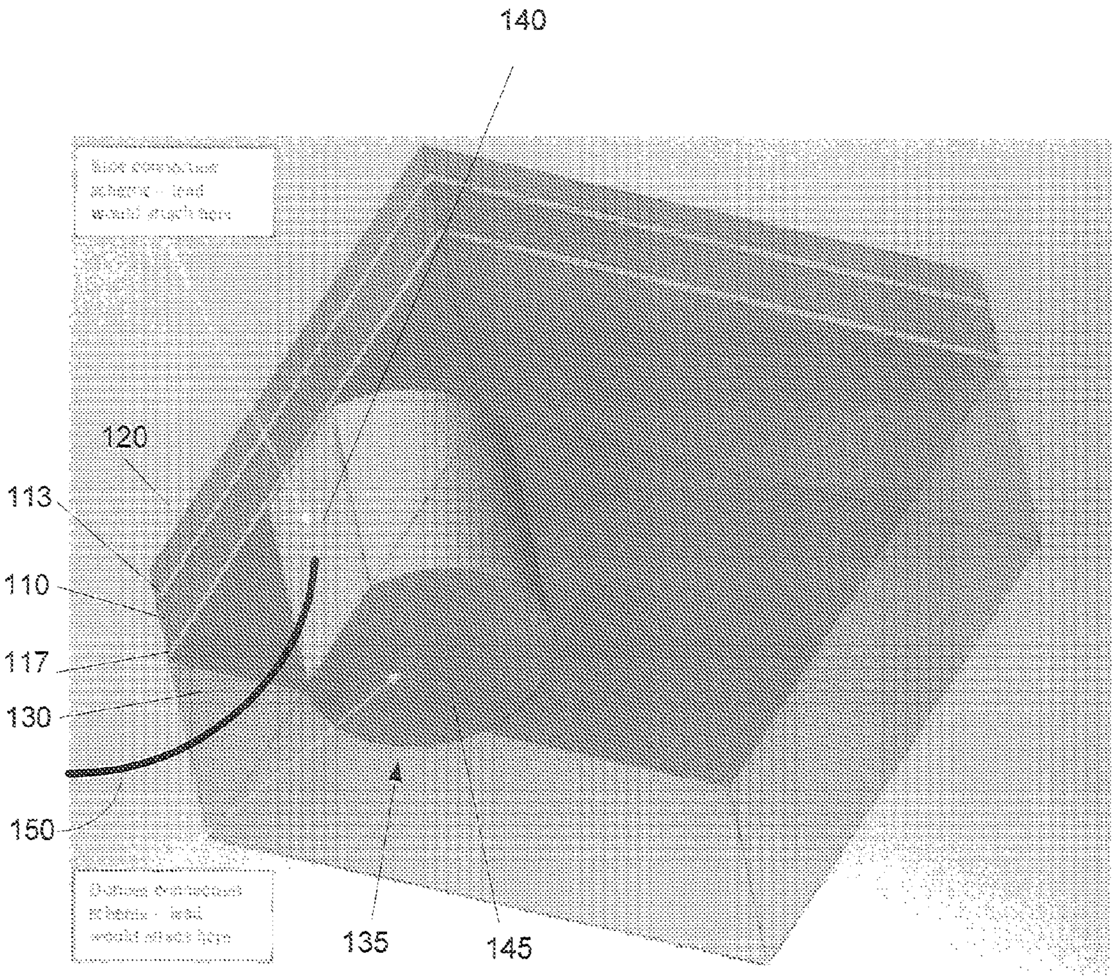
FIG. 4(*a*) shows a lead connected to an exposed side surface of the conductive post according to an embodiment of the present invention.
Figure 4B:
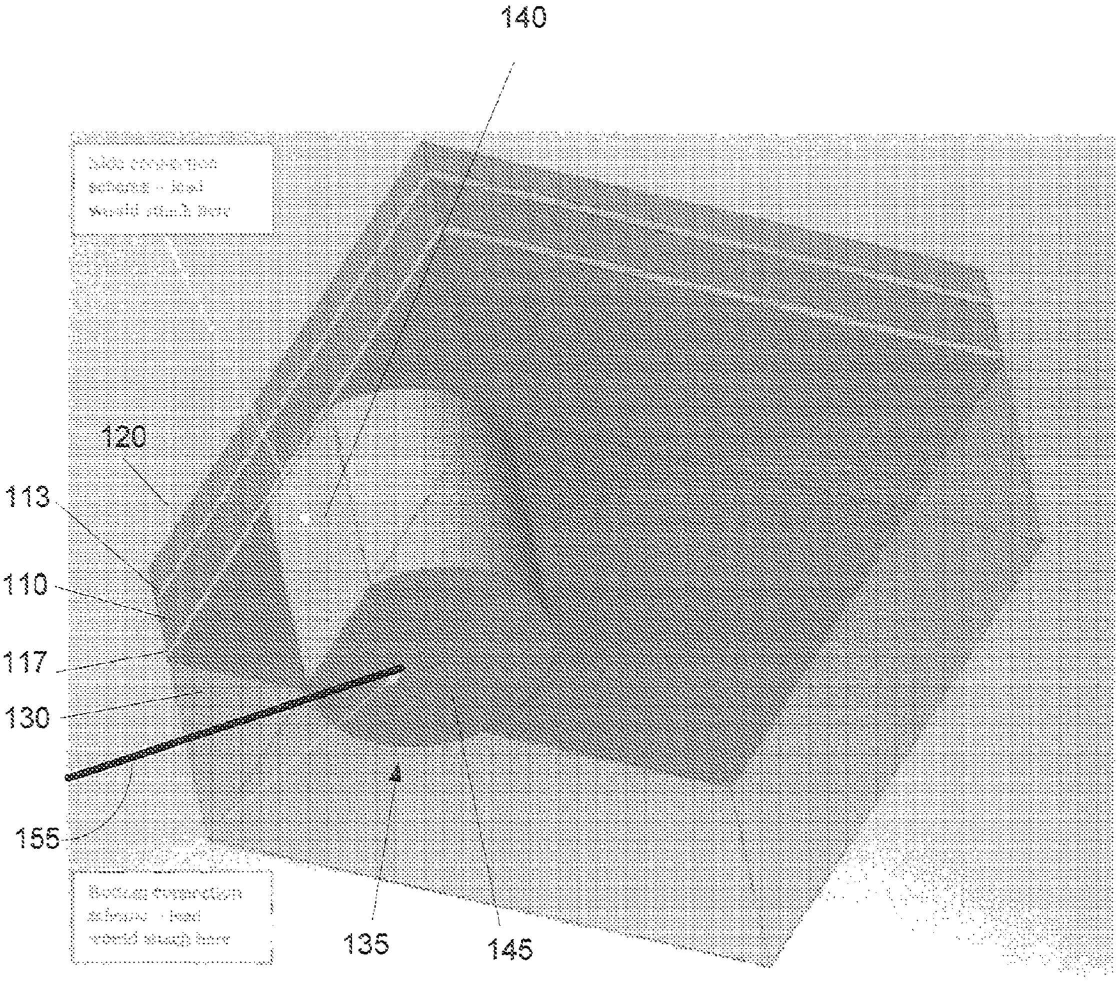
Figure 4C:
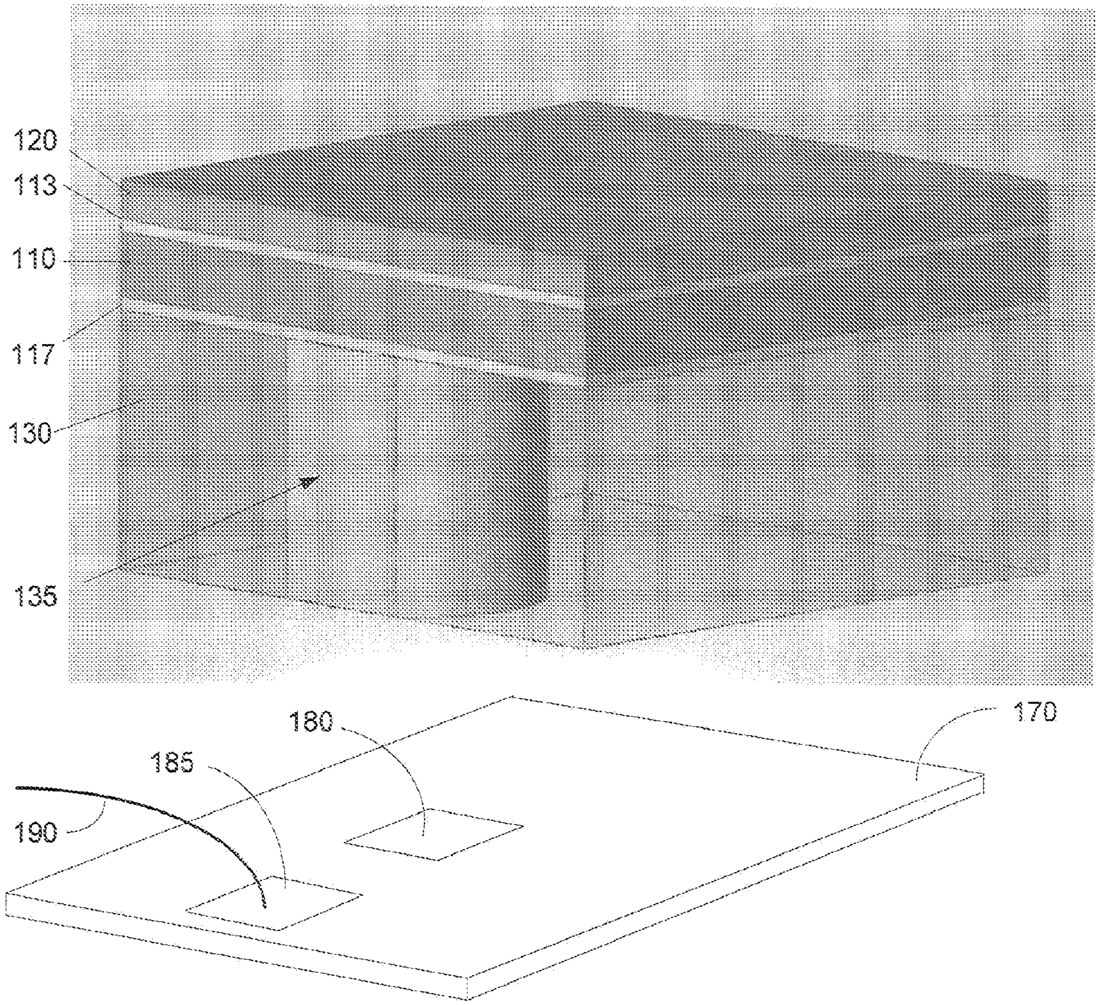
Figure 5A:
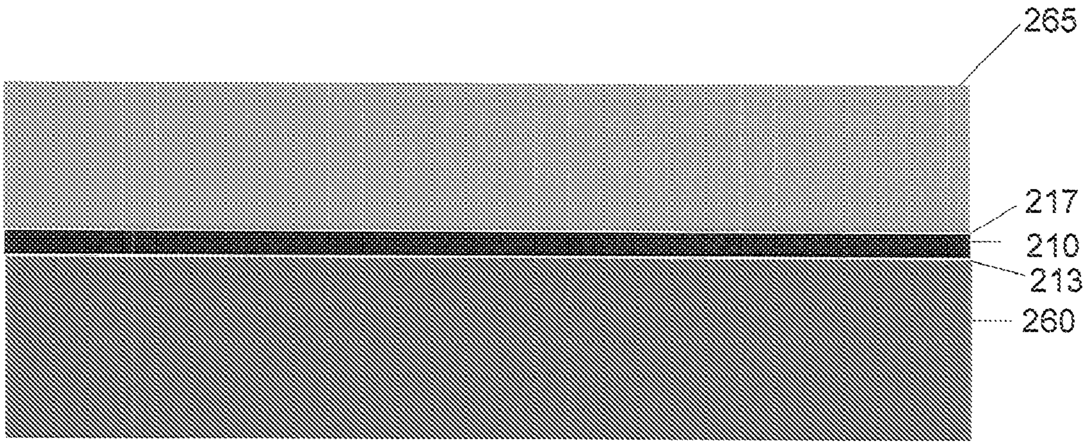
FIGS. 5(*a*)-5(*h*) show steps for a batch process for fabricating transducers according to an embodiment of the present invention.
Figure 5B:
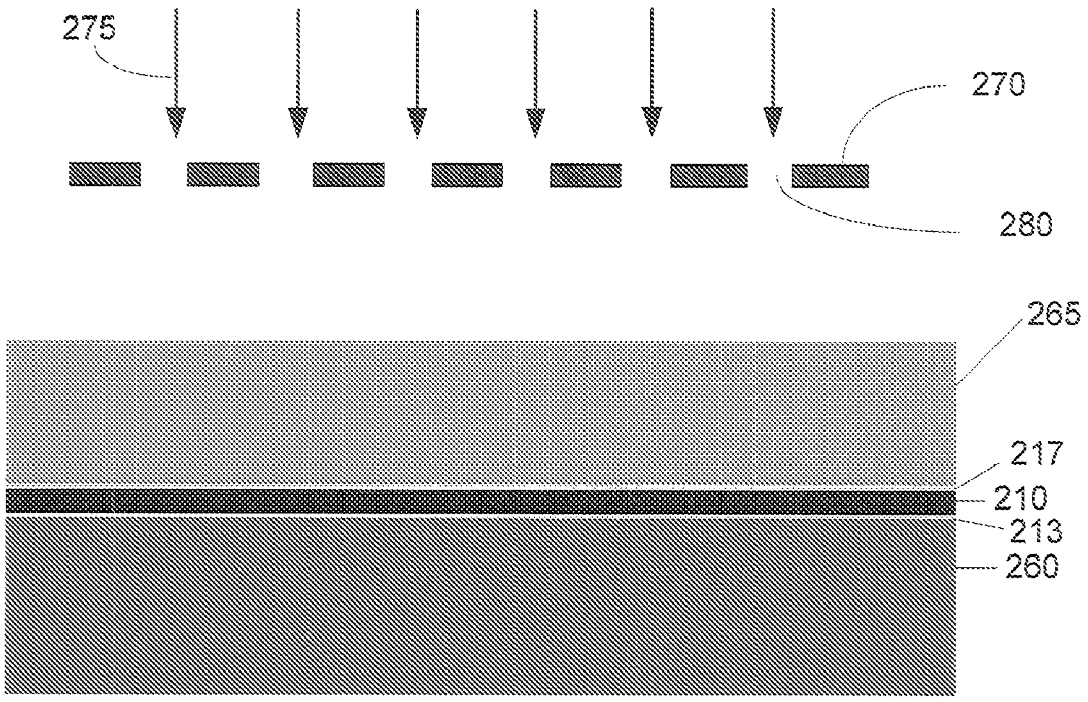
Figure 5C:
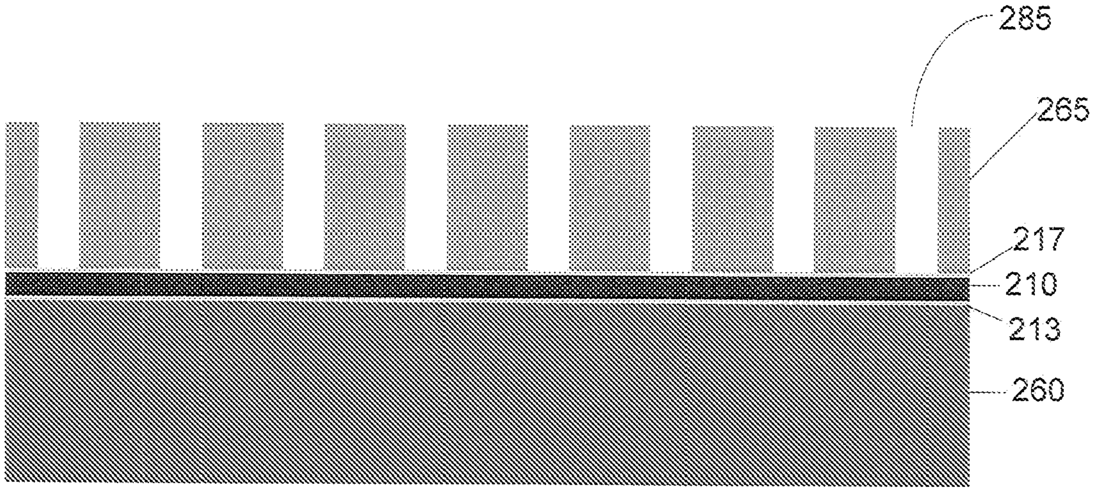
Figure 5D:
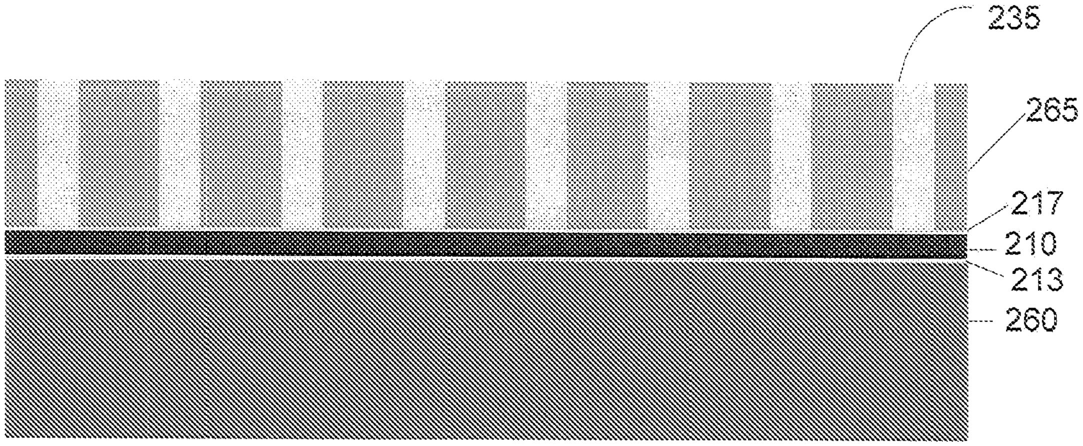
Figure 5E:
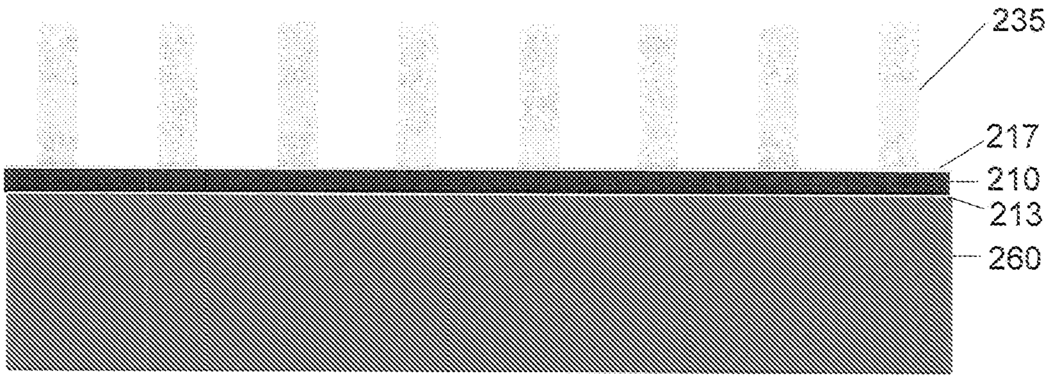
Figure 5F:
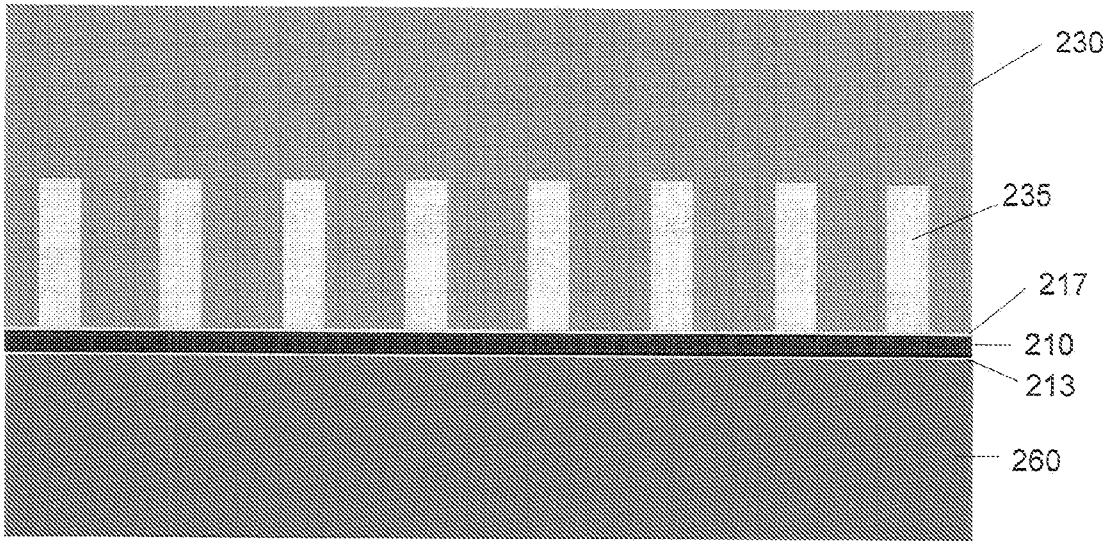
Figure 5H:
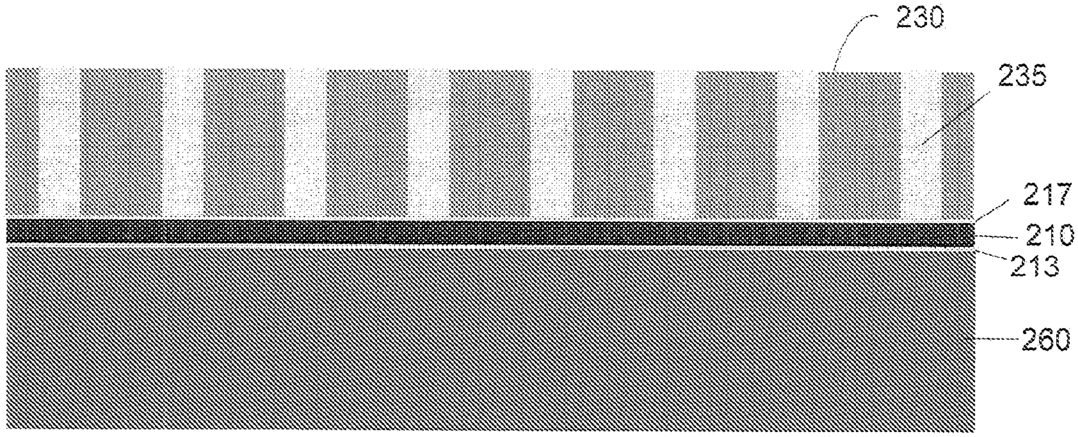
Figure 5H:
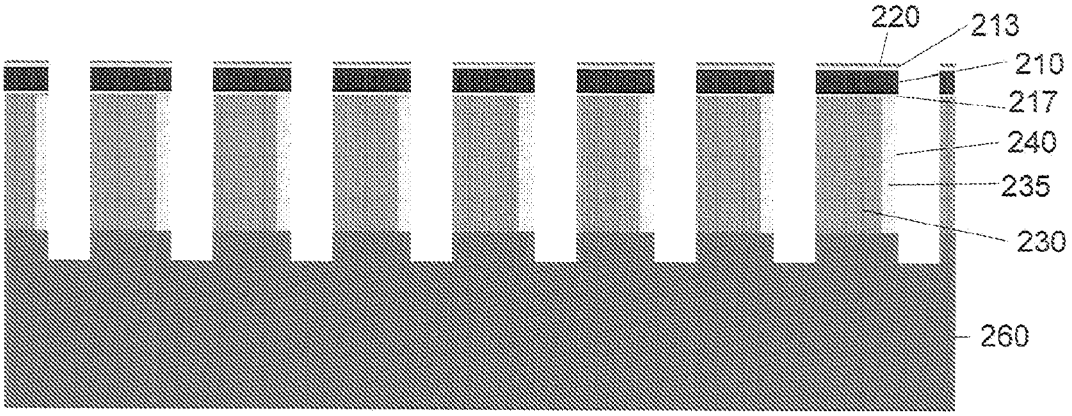

The transducer 105 further comprises a matching layer 120 on top of the active element 110 and a backing layer 130 on the bottom of the active element 110. The transducer 105 further comprises a conductive, e.g., metal, post 135 embedded in the backing layer 130 to provide a direct electrical connection to the active element 110. As discussed further below, the conductive post 135 can be fabricated using current microfabrication techniques, e.g., integrated circuit (IC) and MEMS fabrication techniques. In the embodiment shown in FIGS. 2 and 3, the conductive post 130 includes an exposed side surface 140, e.g., a chamfer, and an exposed bottom surface 145. This allows a lead to be connected to the conductive post 135 on either the exposed side surface 145 or the exposed bottom surface. FIG. 4(*a*) shows an example of the transducer 105 with a lead 150 connected to the side surface 140 of the post 135, e.g., using solder, epoxy, or laser welding. FIG. 4(*b*) shows an example of the transducer 105 with a lead 155 connected to the bottom surface 145 of the post 135. The lead 150 or 155 may be part of a twisted wire pair coupled to an ultrasound system. Alternatively, the lead 150 or 155 may be connected at the other end to a coaxial cable coupled to the ultrasound system. In the Figures, the backing layer is shown semi-transparent so that the embedded conductive post is visible in the Figures.

The conductive post 135 provides a better electrical connection to the active element 110 with lower resistance compared with prior art methods, in which the lead is electrically connected to the active element through a secondary conduction path such as through the housing and/or the backing layer. The series resistance can be reduced considerably depending on the material used for the post 135, e.g., nickel, gold, copper, etc., with gold being the optimal choice from a performance standpoint. Further, the conductive post 135 improves flexibility in the design of the transducer by increasing the number of passive materials that are available to form the transducer. This is because the choice of passive materials is no longer limited to conductive materials. Since the conducive post provides conduction that is independent of the passive material properties, the passive materials do not have to be conductive.

The conductive post 135 provides a more robust connection compared with prior art methods. In prior art methods, the backing layer is formed of a conductive epoxy layer, e.g., epoxy with silver filler, that is connected to the lead with epoxy. This results in an epoxy-to-epoxy connection between the conductive epoxy of the backing layer and the epoxy used to connect the lead to the backing layer. This epoxy-to-epoxy connection is susceptible to cracking and separation during transducer sterilization, in which the transducer is exposed to a sterilizer, e.g., ethylene oxide sterilizer, at elevated temperatures to sterilize the transducer. Connecting the lead to the conductive post 135, e.g., using solder, provides a more robust connection that is better able to withstand sterilization than the epoxy-to-epoxy connection.

FIG. 4(*c*) shows another method of making a connection using the conductive post 135. In this embodiment, a lead 190 is connected to the conductive post 135 through an integrated circuit (IC) chip 170. The IC chip 170 comprises a conductive contact pad 180 for the post 135 and another conductive contact pad 185 for the lead 190. The contact pads may be metal contact pads deposited on the IC chip 170. The contact pad 180 is bonded to the bottom surface 165 of the post 135, e.g., using a solder bump (not shown). Alternatively, the contact pad 180 may be bonded to the side surface of the post 135. The lead 190 is bonded to the conductive pad 185. The IC chip 170 contains a conductive path (not show) beneath an insulating layer, e.g., silicon oxide or other passivation layer, that electrically connects the two pads 180 and 185. The IC chip 170 may be fabricated using well-known IC fabrication techniques, e.g., CMOS fabrication techniques. The IC chip 170 may also contain electronics for processing signals to and from the transducer, e.g., filters and signal processors. For example, the IC chip 170 may contain filters coupled between the contact pads 185 and 180 for filtering out signal noise and/or an amplifier to amplify signals from the transducer before they are put on a long cable to the imaging system.

A conductive post may also be embedded in the matching layer 120 to provide an electrical connection to the active element 110. In an alternative embodiment, a portion of the matching layer 120 may be stripped off to expose a small area of the top electrode 113, and a lead may be connected directly to the exposed area of the top electrode 113. In another alternative embodiment, the matching layer may be made of a conductive material, e.g., silver epoxy, with the lead connected to the matching layer.

Although the exemplary embodiments in the Figures show the conductive post 135 having two exposed surfaces, the post 135 may only have an exposed bottom surface. For example, the post may be located within the backing layer with no exposed side surface. Alternatively, the post may only have an exposed side surface and not extend all the way down to the bottom of the backing layer.

A batch process for fabricating transducers according to an exemplary embodiment will now be given with reference to FIGS. 5(*a*)-5(*h*). The batch process is compatible with MEMS microfabrication techniques. In this example, the post is made of deposited metal, although other conductive materials, e.g., heavily doped silicon, may also be used.

FIG. 5(*a*) shows an active element layer 210, e.g., a piezoelectric element, with electrode layers 213, 217, e.g., gold on chrome electrode. The active element layer 210 rests on a carrier 260, e.g., silicon wafer, for supporting the transducer layers during fabrication. A layer of light-sensitive photoresist 265, e.g., SU-8 or KMPR, is applied on top of the active element 210 using spin coating. The photoesist layer 265 can be either positive or negative based on its response to light. Positive photoresist becomes weaker and more soluble when exposed to light while negative photoresist becomes stronger and less soluble when exposed to light. Photoresists are commonly used in IC and MEMS fabrication with consistent repeatable results.

In FIG. 5(*b*), a mask 270, e.g., chrome on glass, is used in conjunction with light exposure equipment to form a pattern in the photoresist 265. In this example, the photoresist 265 is positive and the mask 270 is transparent in areas where the photoresist 265 is to be removed to form the posts. UV light 275 is filtered through the mask 270 and reaches the underlying photoresist 265. The areas of the photoresist 265 corresponding to the transparent areas 280 of the mask 270 are exposed to the UV light 275. For the example of negative photoresist, the mask would be opaque in areas where the photoresist is to be removed.

In FIG. 5(*c*), the areas of the photoresist 265 that were exposed to light are removed with a developer, e.g., solvent, leaving the desired pattern imprinted in the photoresist 265. The areas where the photoresist 265 has been removed forms voids 285 in the photoresist 265. Preferably, the bottom of the voids 285 are cleaned to obtain complete exposure of the electrode 217 to provide a seed layer for electroplating.

In FIG. 5(*d*) metal is deposited in the voids 285 using electroplating to form the posts 235. The posts 235 may be formed of gold, nickel, copper, or other conductive material.

In FIG. 5(*e*), the photoresist 265 is stripped away leaving the standing posts on the electrode 217. In FIG. 5(*f*), the surface is cleaned and a backing layer 230 is applied over the posts 235 and the exposed electrode 217. The backing layer may be made of epoxy or other material that is cast and then cured to form the backing layer. In FIG. 5(*g*), the backing layer 230 is ground down to remove excess backing material and obtain a flat backing surface.

In FIG. 5(*h*), the transducer layers are flipped over on the carrier 260. The matching layer 220 is applied to the active element layer 210. The transducer layers are then diced to release individual transducers 205. A dicing saw cuts through the transducer layers and partially into the carrier 260 to release the individual transducers 205. In this embodiment, the dicing saw also partially cuts through portions of the posts 235 to form the exposed flat side surfaces 240 of the individual transducers.

Figure 6A:
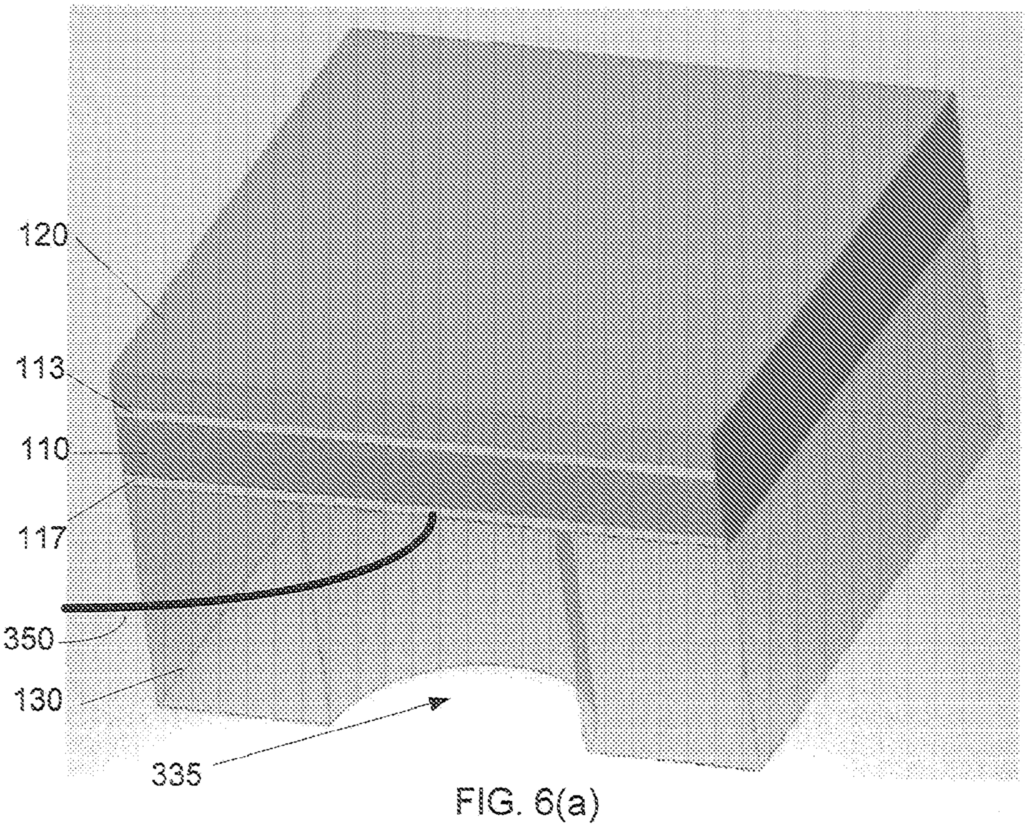
FIGS. 6(*a*) and 6(*b*) show a transducer in which a lead is directly connected to the electrode of the acoustic element according to an embodiment of the present invention.
Figure 6B:
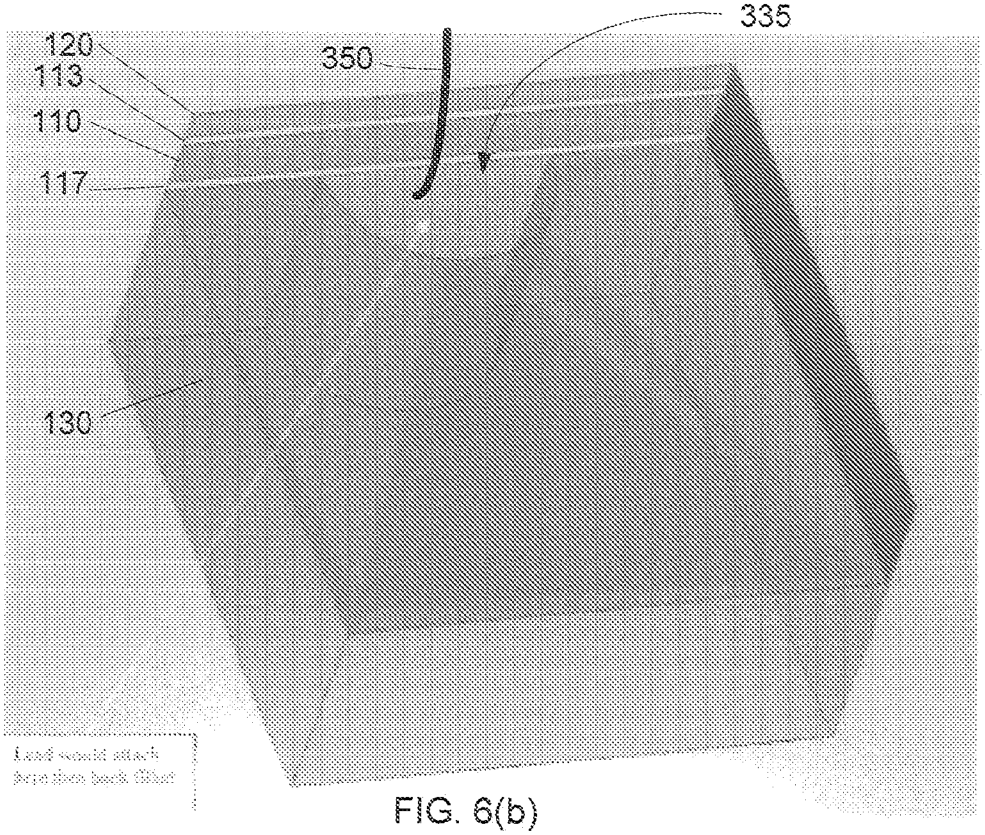

FIGS. 6(*a*) and 6(*b*) show an alternative method for making a connection to the active element 110. In this embodiment, a void 335 is formed in the backing layer 130 to expose an area of the electrode 117. Instead of filing the void with metal to form a metallic post, the lead 350 is connected directly to the exposed area of the electrode 117 through the void 335, e.g., using solder, epoxy, or the like. After the lead 350 is connected to the electrode 117, the void 335 can be filled with the same passive material (not shown) used for the backing layer 130 to maintain uniformity. In this embodiment, the backing layer 130 may be made of a material that can be easily dissolved, e.g., wax or photoresist, to form the void. For example, for a backing layer 130 comprising a photoresist layer, the photoresist layer may be exposed to UV light through a mask having a pattern that defines the void. The light exposure through the filter transfers the mask pattern defining the void to the photoresist layer. After light exposure, the photoresist layer may be selectively dissolved to form the void 335, e.g., using a developer, based on the transferred pattern.

Figure 7:
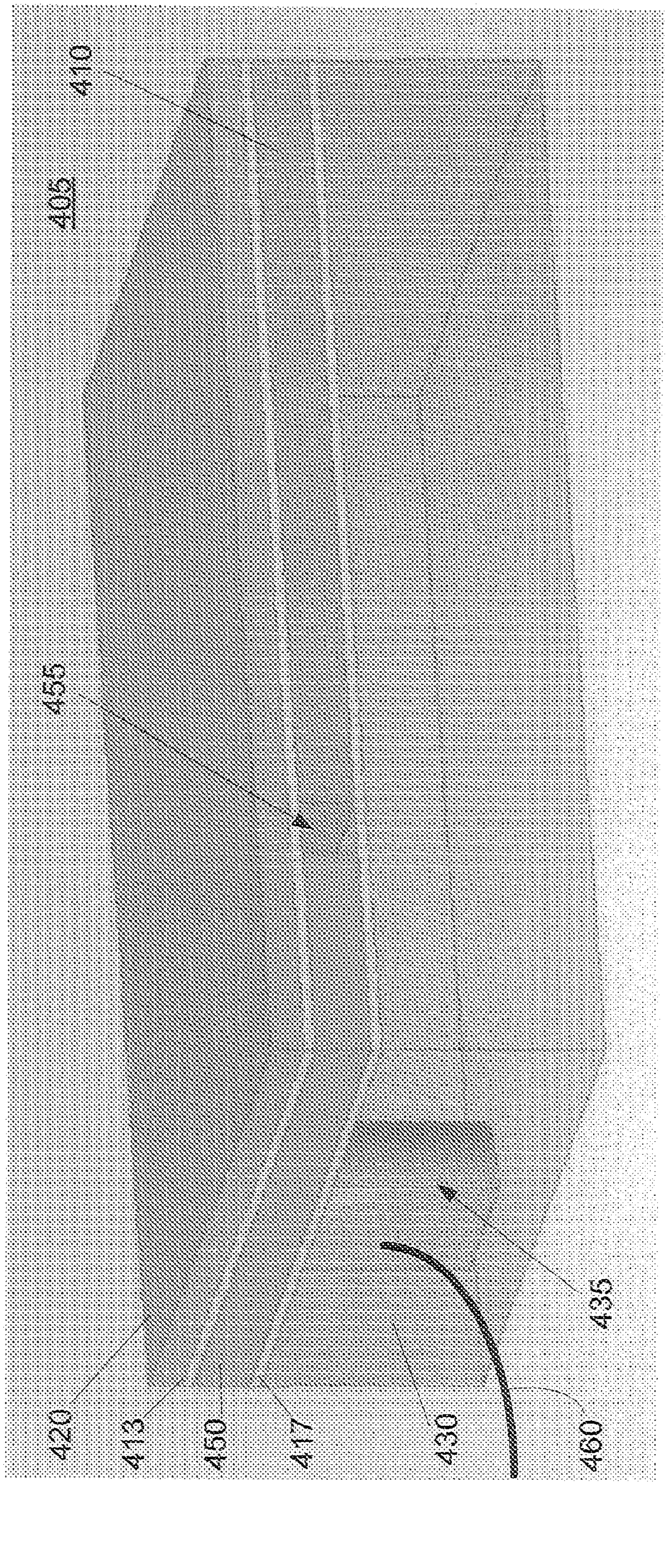
FIG. 7 shows a transducer comprising an extension substrate adjacent to the acoustic element according to an embodiment of the present invention.
Figure 8A:
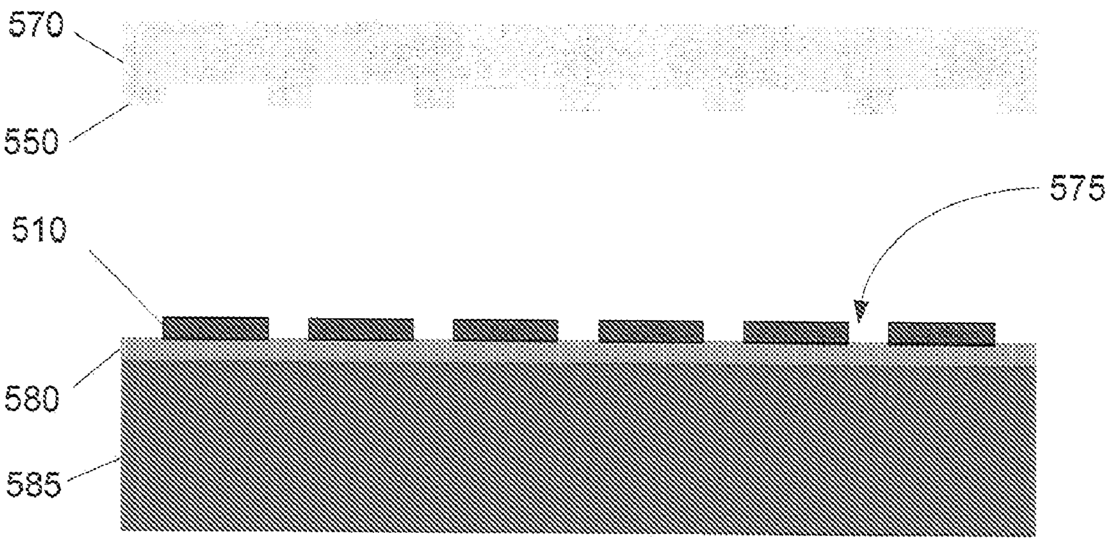
FIGS. 8(*a*)-8(*h*) show steps for a batch process for fabricating transducers comprising extension substrates according to an embodiment of the present invention.
Figure 8B:
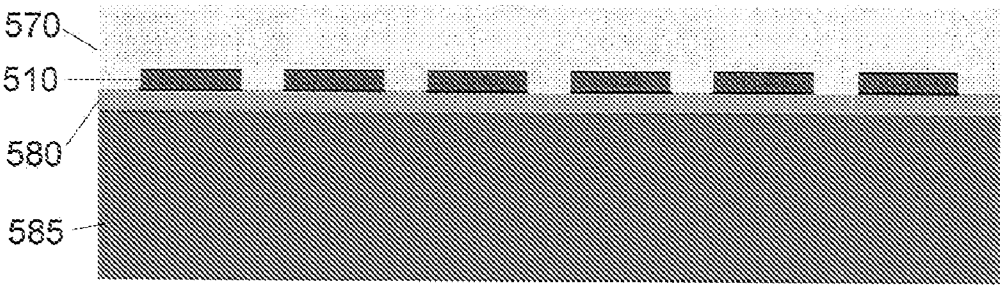
Figure 8C:
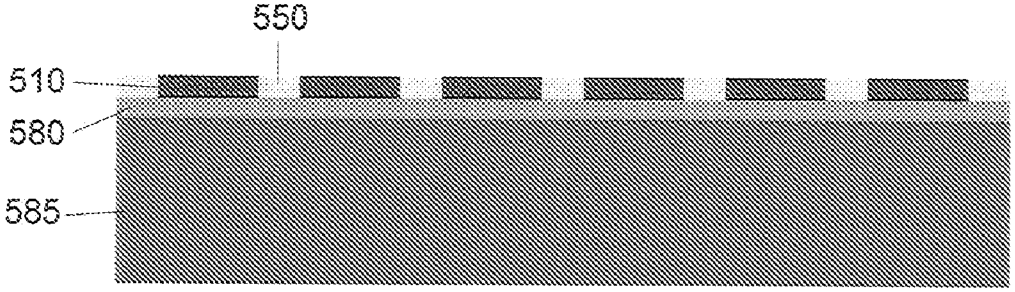
Figure 8D:
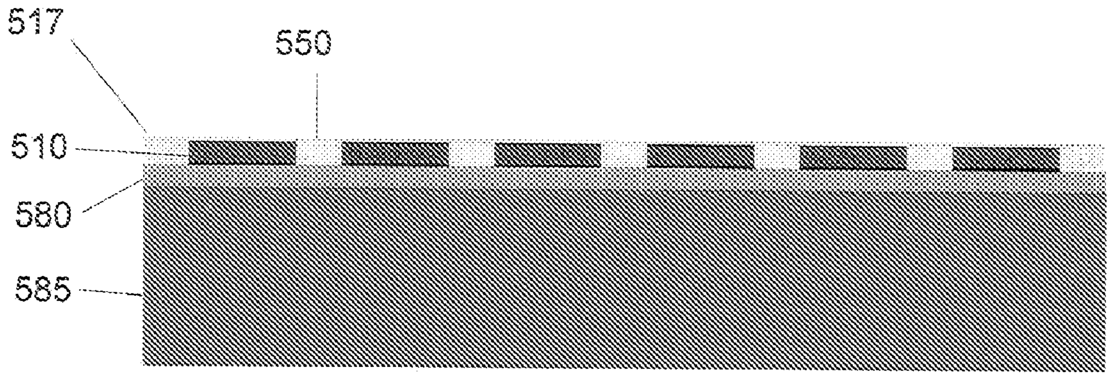
Figure 8E:
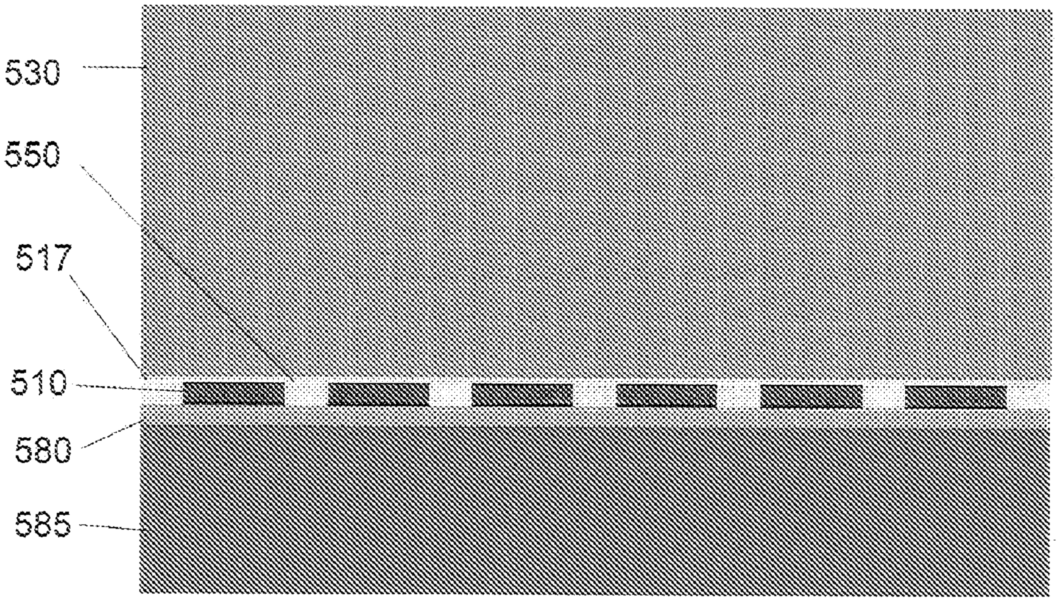
Figure 8F:
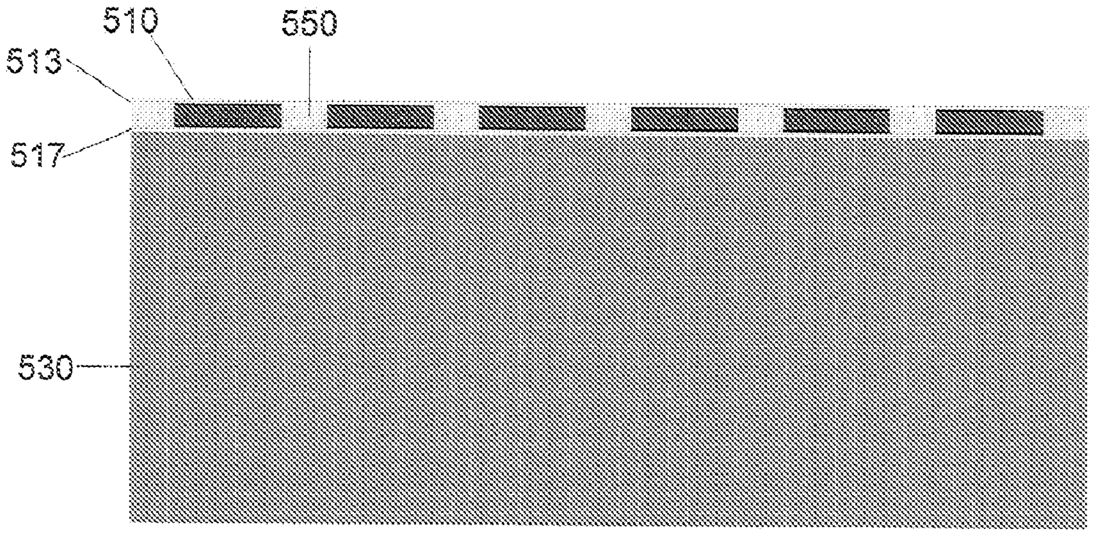
Figure 8G:
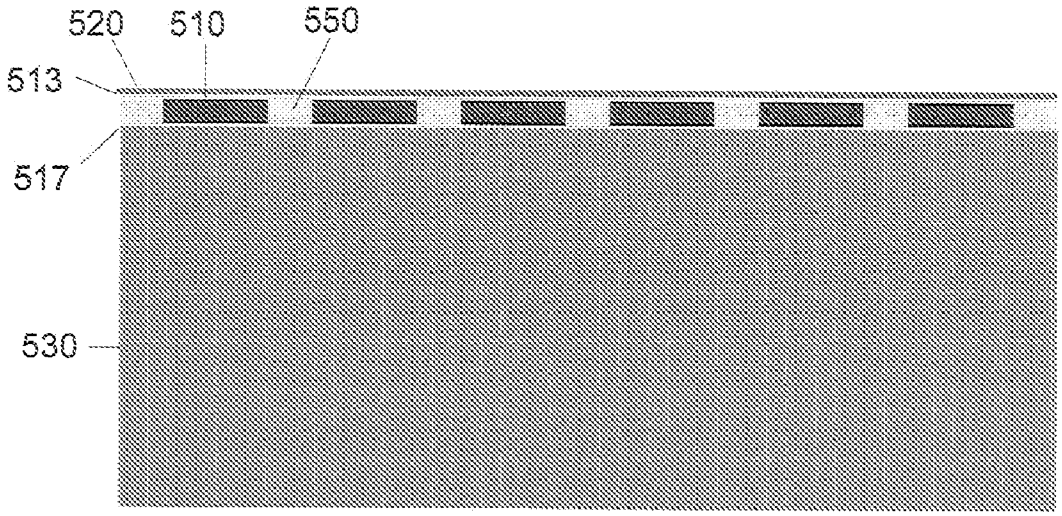
Figure 8H:
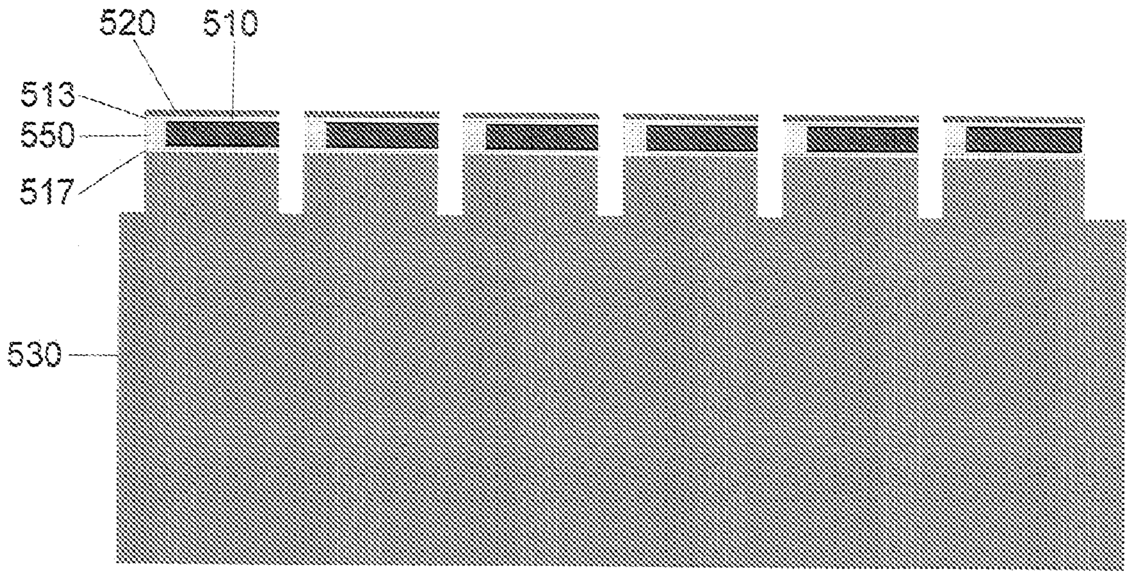

FIG. 7 shows a transducer 405 according to another exemplary embodiment of the invention. In this embodiment, the transducer 405 comprises an extension substrate 450 at the same level as the active element 410 and having the same thickness. The extension substrate 450 may be made of the same material as the active element 410 or different material. The extension substrate 450 may be separated from the active element 410 by a gap 455, e.g., filled with epoxy. The transducer 405 further comprises top and bottom electrodes 413 and 417, a matching layer 420, a backing layer 430, and a conductive, e.g., metal, post 435 embedded in the backing layer 430. The conductive post 435 is connected to the bottom electrode 417 and aligned with the extension substrate 450. Preferably, the extension substrate 450 is made of a material with favorable properties for making electrical connections. For example, silicon may used for the extension substrate 450 because of its excellent electrical properties and stability, and the well developed integrated processing for silicon at the miniaturization level.

The extension substrate 450 reduces the risk of damage to the active element 410 when connections are made to the electrodes 413 and 417. For example, when a lead 460 is soldered to the post 435, the region around the post 435 is raised to a high temperature. By aligning the post 435 with the extension substrate 450 instead of the active element 410, the extension substrate 450 is subjected to the high temperatures and thermal stress associated with soldering instead of the active element 410, thereby protecting the active element 410. This is important because high temperatures, thermal shock and similar conditions can cause several failure modes in piezo materials such as depoling (which irreversibly destroys the piezo properties of the material) cracking, and reduced material integrity. By protecting the active element 410, the extension substrate 450 reduces the risk of damage to the active element 410. Further, the extension substrate 450 allows more robust connection techniques to be used that would otherwise not be possible due to the sensitivity of piezo materials to high temperatures, thermal shock and similar conditions.

A batch process for fabricating transducers with extension substrates according to an exemplary embodiment will now be given with reference to FIGS. 8(*a*)-8(*h*). The batch process is compatible with MEMS microfabrication techniques. In this example, the post is made of deposited metal, although other conductive materials, e.g., heavily doped silicon, may also be used.

FIG. 8(*a*) shows active elements 510, e.g., a piezoelectric elements, lying on a photoresist layer 580 and a carrier substrate 585. The active elements 510 may be formed by dicing a piezo wafer into individual piezo elements. FIG. 8(*a*) also shows a silicon wafer 570 with the extension substrates 550 etched into the wafer and corresponding to the spaces 575 between the active elements 510. The silicon 570 can be fabricated using well-known CMOS microfabrication techniques to form the extension substrates 510.

In FIG. 8(*b*), the extension substrates 550 of the silicon wafer 570 are aligned with the spaces between the active elements 510. The silicon wafer 570 is then overlaid onto the active elements 510 with the extension substrates 510 inserted between the active elements 510. The silicon wafer 570 is held in place using a filer epoxy.

In FIG. 8(*c*), the unused portion of the silicon wafer is lapped off to reach the desired active element thickness. In FIG. 8(*d*), a first electrode layer 517, e.g., gold on chrome, is deposited, e.g., sputtered, on the active elements 510 and substrate extensions 550. In FIG. 8(*e*), a backing material is cast on the electrode layer 517, and then cured to form the backing layer 530. The backing layer 530 may be made of epoxy, polymer or other material. In FIG. 8(*f*), the active elements 510 and substrate extensions 550 are released from the carrier 585 by dissolving the photoresist layer 580, and flipped over so that the backing layer 530 is below. A second electrode layer 513, e.g., gold on chrome, is deposited, e.g., sputtered, on the active elements 510 and substrate extensions 550. In FIG. 8(*g*), a matching layer 520 is deposited on the second electrode layer 513. The matching layer 520 may be spin coated on the electrode layer 513. In FIG. 8(*h*), the matching layer 520, electrodes 513 and 517, silicon 550, and backing layer 520 are diced, e.g., using a dicing saw, to separate the transducers. The backing layers of the individual transducers may then be cut away from the main backing layer to release the transducers.

Metal posts can be embedded in the backing layers of the transducers by including additional process steps based on the process shown in FIGS. 5(*a*)-5(*h*). For example, metal posts can be embedded in the backing layer 530 by adding the process steps for forming the metal posts in steps 8(*d*) and 8(*e*) and casting the backing layer 530 on the metal post.

When silicon or other semiconductor is used for the extension substrate, an integrated circuit can be fabricated on the extension substrate, e.g., using a CMOS process. The integrated circuit can include, e.g., filters for filtering signals, an amplifier for amplifying signals from the transducer, and other processing electronics. Placing an integrated circuit next to the transducer can reduce signal noise and/or signal loss caused by the long cable from the transducer to the imaging system and can reduce the amount of processing that needs to be done at the system side.

Figure 9:
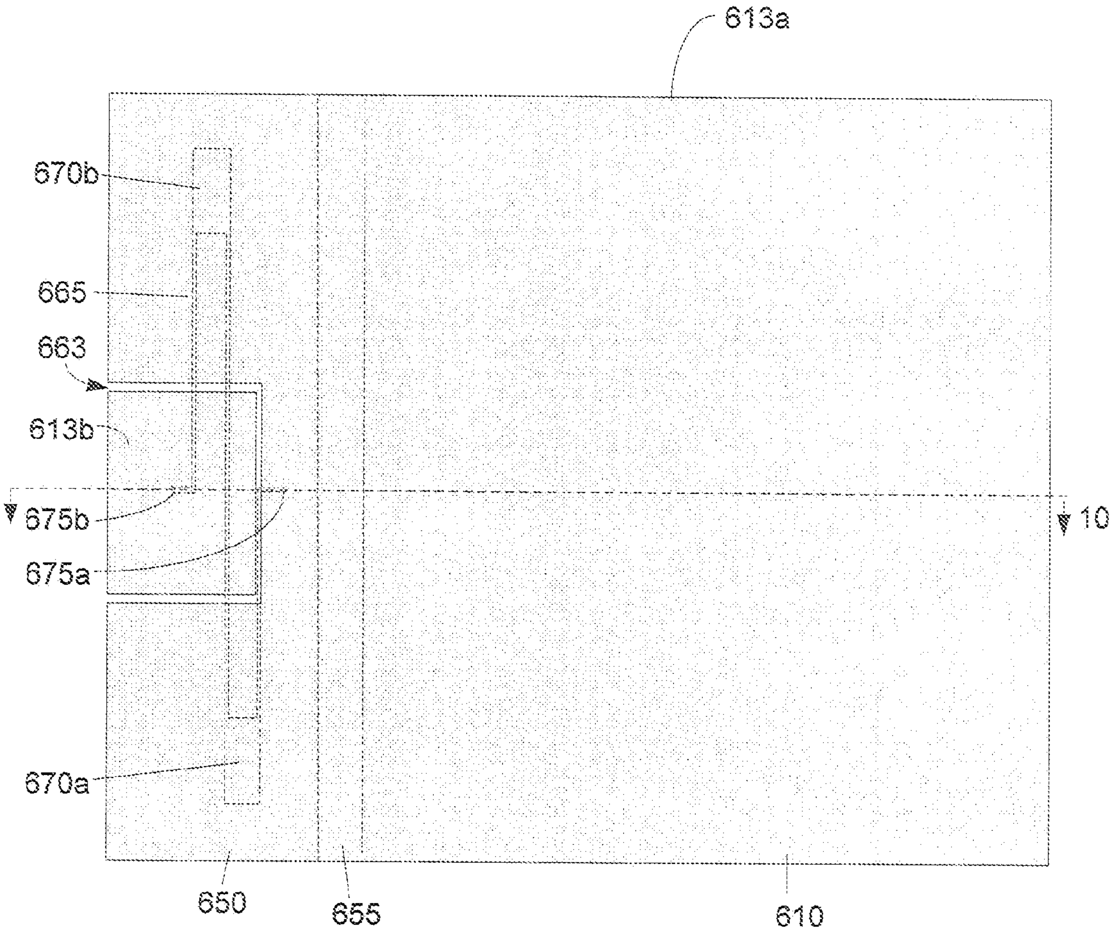
FIG. 9 shows a top view of electrodes of a transducer comprising an extension substrate according to an embodiment of the present invention.
Figure 10:
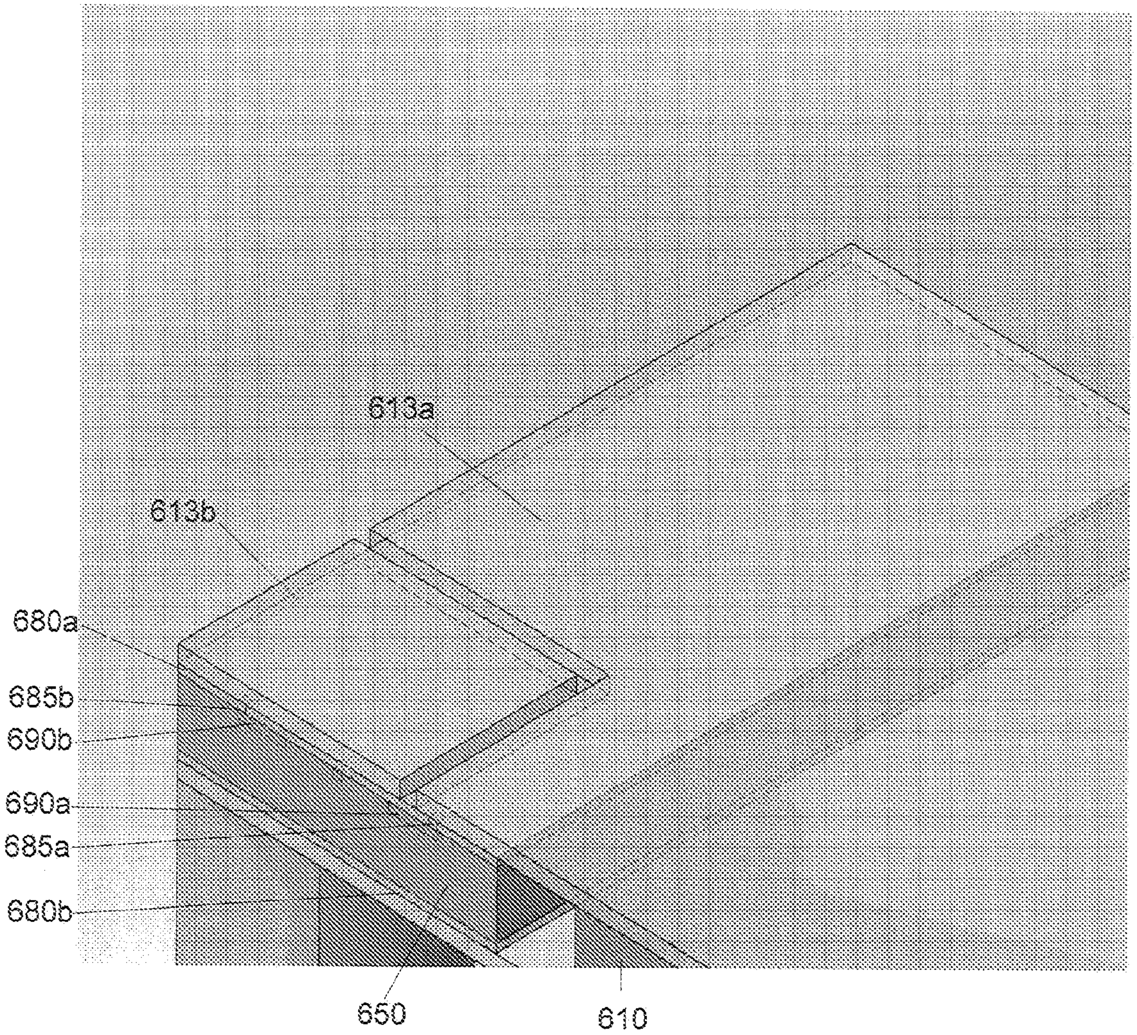
FIG. 10 shows a cross-section view of a transducer comprising an extension substrate according to an embodiment of the present invention.

FIGS. 9 and 10 illustrate an extension substrate, e.g., silicon extension substrate, with an integrated circuit according to an embodiment of the invention. In this example, the circuit is integrated on the top of the extension substrate 650, although it is to be understood that the circuit may also be integrated on the bottom. FIG. 9 shows a top view of electrodes 613*a*, 163*b* placed over the extension substrate 650 and the active acoustic element 610. FIG. 10 shows a cross-sectional view of the transducer with the matching layer removed for ease of illustration. The top electrode comprises a first electrode 613*a* overlapping the extension substrate 650 and the active element 610 and a second electrode 613*b* over the extension substrate 650 and separated from the first electrode 613*a* by an isolation gap 663. The electrodes may be patterned using well-known microfabrication techniques, e.g., metal etching. FIG. 10 also shows an example of circuit blocks 670*a*, 670*b* integrated on the extension substrate 650 and interconnected by conductive traces 665, e.g., metal traces. The circuits may be fabricated using well-known CMOS fabrication techniques, which can be used to fabricate filters, amplifiers, and other electronics to process signals to and from the active element 610. The layout of the circuit blocks 670*a*, 670*b* shown in FIG. 9 is exemplary only as other layouts may be used.

Referring to FIG. 10, the first electrode 613*a* is electrically connected to the integrated circuits by a via 685*a* and traces 665, 690*a*. Trace 690*b* connects to trace 665 at point 675*a*. The first electrode 613*a* electrically connects the extension substrate 650 to the active element 610. The second electrode 613*b* is electrically connected to the integrated circuits by a via 685*b* and traces 690*b*, 665. Trace 690*b* connects to the trace 665 at point 675*b*. In this example, the traces 665 and 690*a*, 690*b* are underneath a thin passivation layer, e.g., oxide, of the extension substrate 650 with the vias 685*a*, 685*b* interconnecting the electrodes 613*a*, 613*b* to the lower level traces 690*a*, 690*b*. The vias 685*a*, 685*b* may be made of metal or other conductive material. In FIG. 10, the electrodes 613*a*, 613*b* are shown semi-transparent so that the underlying extension substrate 650 and active element 610 are visible in FIG. 10.

Figure 11:
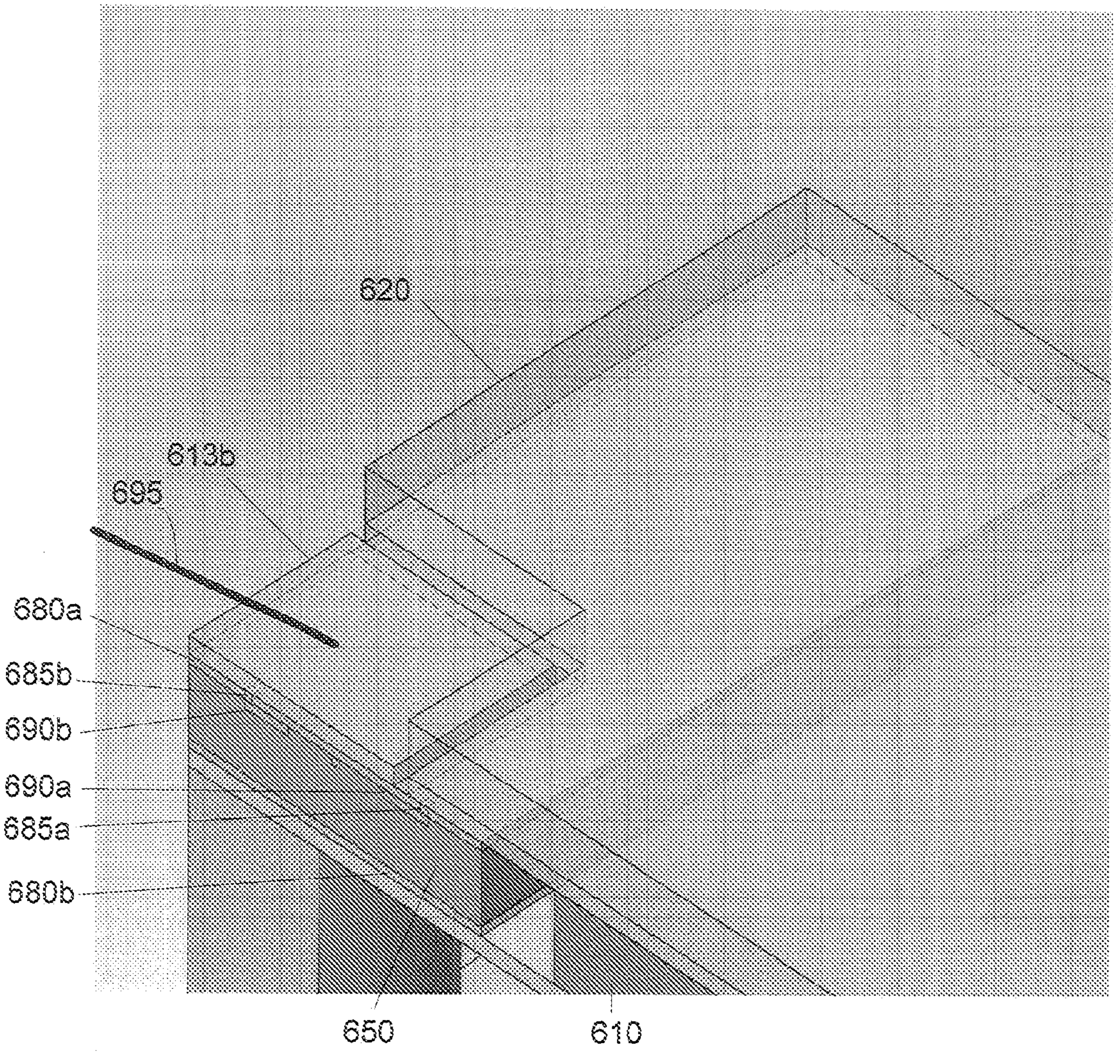
FIG. 11 shows a lead connected to an electrode of a transducer through an opening in the matching layer according to an embodiment of the present invention.
Figure 12:
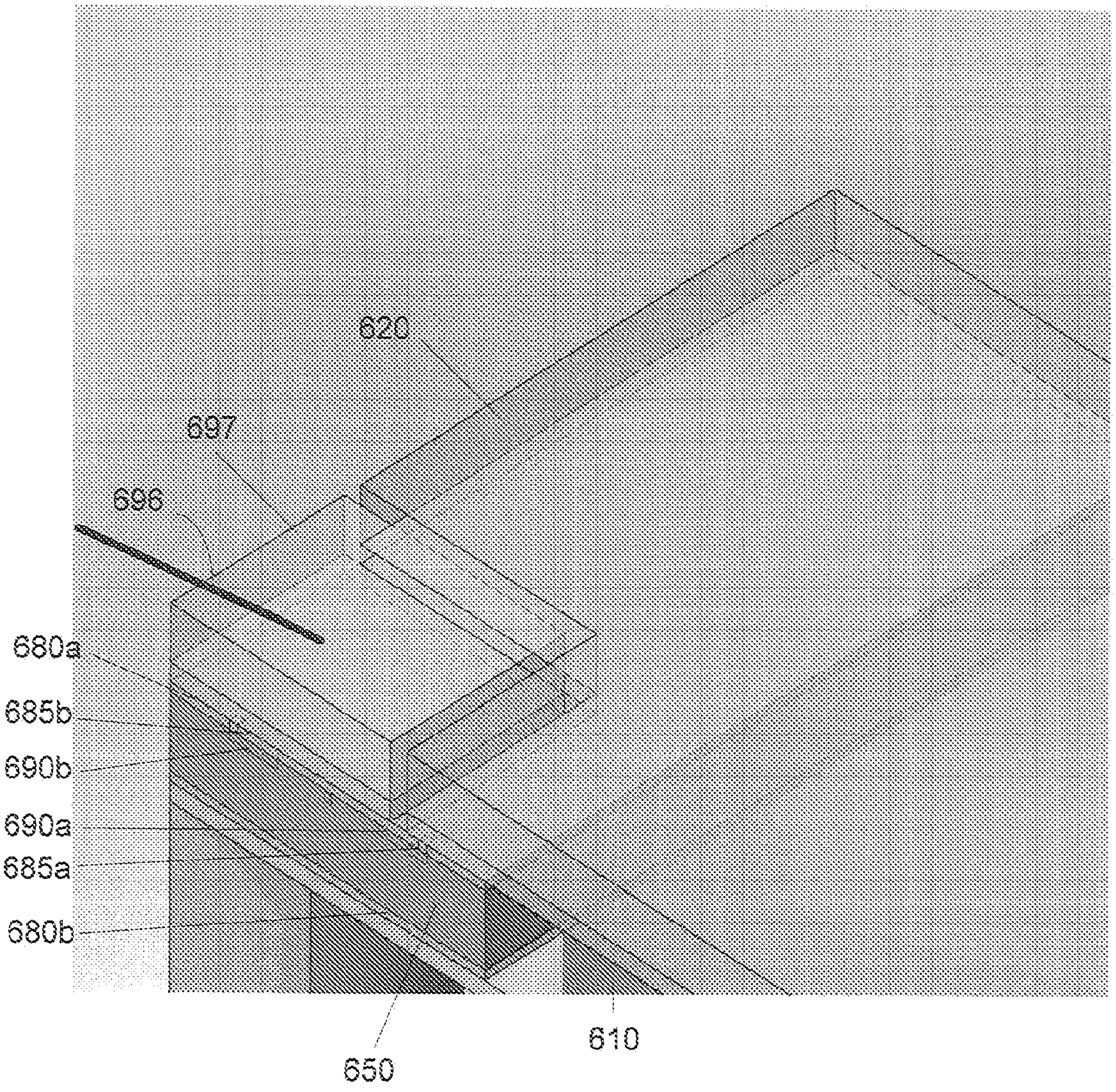
FIG. 12 shows a lead connected to an electrode of a transducer through a conductive post in the matching layer according to an embodiment of the present invention.

FIG. 11 shows an example of a lead 695 electrically connected to the second electrode 613*b* through an opening in the matching layer 620. The matching layer 620 may be striped away or masked off to form the opening. The other end of the lead may be connected to a twisted wire pair or a coaxial cable for coupling electrical signals between the transducer and an ultrasound imaging system. FIG. 12 shows another example of a lead 696 electrically connected to the second electrode 613*b* through a conductive, e.g., metal, post 697 deposited on the electrode 613*b*. The conductive post 697 may be fabricated using similar techniques used to fabricated the post embedded in the backing layer. In FIGS. 11-12, the electrodes 613*a*, 613*b*, and matching layer 620 are shown semi-transparent so that the underlying extension substrate 650 and active element 610 are visible in the FIGS. 11-12.

During operation, an electrical signal, e.g., transmit pulse, to the transducer travels through the second electrode 613*b*, the via 685*b*, and traces 690*b*, 665 to the integrated circuit 670*a*, 670*b* on the extension substrate 650. The integrated circuit 670*a*, 670*b* may process the signal or pass the signal without processing it. The signal then travels through the traces 665, 690*a*, via 685*a*, and the first electrode 613*a* to the active element 610. An electrical signal from the active element 610 may also travel through the integrated circuit 670*a*, 670*b* for processing, e.g., amplification, filtering or the like, before traveling down the long cable to the ultrasound imaging system. The active element 610 may produce this signal in response to a return ultrasound wave received by the active element 610.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions described herein is merely illustrative, and the invention can be performed using different or additional process actions, or a different combination or ordering of process actions. As a further example, each feature of one embodiment can be mixed and matched with other features shown in other embodiments. Additionally and obviously, features may be added or subtracted as desired. Accordingly, the invention is not to be restricted except in light of the attached claims and their equivalents.

What is claimed is:

1. An ultrasound transducer comprising:

an active acoustic element; and a passive layer having a top surface, a bottom surface opposite the top surface, and at least one side surface extending from the top surface to the bottom surface, wherein the active acoustic element is attached to the top surface of the passive layer, the passive layer comprising:

a layer of material; and a conductive post embedded in the layer of material and electrically connected to the active acoustic element, wherein the conductive post is exposed along the side surface of the passive layer.

2. The transducer of claim 1, wherein the active acoustic element comprises a piezoelectric element.

3. The transducer of claim 1, wherein the material comprises a polymer.

4. The transducer of claim 1, wherein the passive layer forms a backing layer that attenuates ultrasound energy propagation below the active acoustic element.

5. The transducer of claim 1, wherein the conductive post comprises a metal post.

6. The transducer of claim 1, wherein the exposed side surface of the conductive post is substantially flat.

7. The transducer of claim 1, further comprising a lead connected to the exposed side surface of the conductive post.

8. The transducer of claim 1, further comprising an integrated circuit (IC) chip connected to the exposed side surface of the conductive post.

9. The transducer of claim 1, wherein the conductive post has a bottom surface that is exposed on the bottom surface of the passive layer.

10. The transducer of claim 9, further comprising a lead connected to the exposed bottom surface of the conductive post.

11. The transducer of claim 9, further comprising an integrated circuit (IC) chip connected to the exposed bottom surface of the conductive post.

12. An ultrasound transducer comprising:

an active acoustic element having a top surface, a bottom surface opposing the top surface, and at least one side surface extending from the top surface and the bottom surface;

an extension substrate having a top surface, a bottom surface opposing the top surface, and at least one side surface extending from the top surface and the bottom surface, wherein at least a portion of the side surfaces of the active acoustic element and extension substrate face each other and wherein the extension substrate comprises an integrated circuit formed therein; and a first electrode electrically connected to, and disposed on the top surface of, both the active acoustic element and the extension substrate.

13. The transducer of claim 12, wherein the acoustic element and the extension substrate have substantially the same thickness.

14. The transducer of claim 12, wherein the extension substrate comprises silicon.

15. The transducer of claim 12, wherein the active acoustic element comprises a piezoelectric element.

16. The transducer of claim 12, further comprising a second electrode separated from the first electrode by an isolation gap, and electrically connected to the extension substrate.

17. The transducer of claim 16, wherein one terminal of the integrated circuit is electrically connected to the first electrode and another terminal of the integrated circuit is electrically connected to the second electrode.

18. The transducer of claim 17, wherein the integrated circuit comprises an amplifier or a filter.

19. The transducer of claim 12, further comprising a passive layer attached to the electrode, the passive layer comprising:

a layer of material; and a conductive post embedded in the layer of material, wherein the conductive post is aligned with the extension substrate.

20. A method of fabricating the transducer of claim 12, comprising:

placing the extension substrate adjacent to the active acoustic element on a surface of the first electrode, wherein the first electrode is connected to the extension substrate and the active acoustic element;

placing a conductor on a surface of the first electrode opposite the extension substrate and the active acoustic element, wherein the conductor is aligned with the extension substrate; and connecting the conductor to the first electrode at an elevated temperature.

21. The method of claim 20, wherein connecting comprises soldering the conductor to the first electrode.

22. The method of claim 20, wherein connecting comprises laser welding the conductor to the first electrode.

23. The method of claim 20, wherein the active acoustic element comprises a piezoelectric element.

* * * * *